United States Patent [19]

Sawamoto

[11] Patent Number: 5,396,605
[45] Date of Patent: Mar. 7, 1995

[54] BUFFER STORAGE CONTROL APPARATUS INCLUDING A TRANSLATION LOOKASIDE BUFFER AND AN IMPROVED ADDRESS COMPARATOR LAYOUT ARRANGEMENT

[75] Inventor: Hideo Sawamoto, Hadano, Japan

[73] Assignee: Hitachi, Ltd., Tokyo, Japan

[21] Appl. No.: 565,133

[22] Filed: Aug. 10, 1990

[30] Foreign Application Priority Data

Aug. 10, 1989 [JP] Japan .................. 1-207716

[51] Int. Cl.⁶ .............. G06F 12/00; G06F 13/00; G06F 5/06; G11C 5/02
[52] U.S. Cl. .................. 395/400; 395/425; 395/250; 364/DIG. 1; 365/51; 365/63
[58] Field of Search ............... 395/425, 250, 400, 325; 365/51, 63

[56] References Cited

U.S. PATENT DOCUMENTS

| 4,056,844 | 11/1977 | Izumi | 395/425 |
| 4,424,562 | 1/1984 | Genma et al. | 395/400 |
| 4,618,926 | 10/1986 | Kubo et al. | 395/425 |
| 4,683,533 | 7/1987 | Shiozaki et al. | 395/250 |
| 4,943,914 | 7/1990 | Kubo | 395/425 |
| 5,050,126 | 9/1991 | Tanaka et al. | 365/189.07 |
| 5,109,335 | 4/1992 | Watanabe | 395/400 |

FOREIGN PATENT DOCUMENTS

| 54-102930 | 8/1979 | Japan . |
| 57-B-57784 | 6/1982 | Japan . |
| 63-101944 | 5/1988 | Japan . |

Primary Examiner—Glenn Gossage
Attorney, Agent, or Firm—Antonelli, Terry, Stout & Kraus

[57] ABSTRACT

A buffer storage control apparatus includes a plurality of sets of buffer address arrays, each of the sets storing the same content and being allocated to one of a plurality of rows of a translation look-aside buffer. With this arrangement, it is possible to reduce the length of wiring lines leading from the translation look-aside buffer to the buffer address arrays and to minimize intersections of the wiring lines, thereby reducing signal delays.

18 Claims, 7 Drawing Sheets

BUFFER STORAGE CONTROL APPARATUS INCLUDING A TRANSLATION LOOKASIDE BUFFER AND AN IMPROVED ADDRESS COMPARATOR LAYOUT ARRANGEMENT

BACKGROUND OF THE INVENTION

1. Field of the Invention

This invention relates to a computer in which a virtual storage and a buffer storage are employed, and more particularly, to a buffer storage control apparatus for such a computer.

2. Description of the Related Art

Large-scale and medium-scale computers of recent years usually employ both a virtual storage and a buffer storage. The virtual storage enables a programmer to do coding without regard to the size of a real storage, and provides the programmer with the convenience of addressing a virtual address on a virtual storage rather than a rear address on a real storage. On the other hand, the buffer storage system is a system in which a high-speed and small-capacity buffer storage is located (performance wise) between a central processing unit and a main storage to provide hierarchical storage, in order to supplement a performance gap wherein the main storage is large in capacity but is low in accessing speed in comparison to the operation rate of the central processing unit.

In the virtual storage system, it is necessary to translate a virtual address into a real address before accessing the main storage. This translation is performed by referring to an address translation table in the main storage which is prepared by a program. A time overhead of address translation is large if the program accesses to the main storage at a low speed every time accessing the storage. In order to minimize the number of occurrences of such slow accessing, a translation lookaside buffer (hereinafter called "TLB"), is used as a high speed translation table, wherein translation pairs, i.e., virtual addresses and real addresses, each obtained by accessing the main storage only once, are stored. Before accessing the main storage for a desired translation, first a check is made on whether or not the virtual address to be accessed exists in the TLB. If it exists (this probability is very high due to the locality of reference by a program), a real address can be obtained at a high speed.

In the buffer storage system, since a buffer storage is a copy of part of the main storage, them is provided a buffer address array (hereinafter called "BAA") for storing information representing which part of the main storage the present buffer storage information corresponds to. Before the central processing unit starts accessing the main storage with a virtual address, a check is first made on whether or not the real address translated by the TLB exists in the BAA. If it exists (this probability is also very high due to the locality of reference), a slow speed accessing of the main storage can be avoided, with the data being read instead from the buffer storage at high speed and then transferred to the central processing unit.

In the foregoing description, accessing of the TLB and BAA are performed serially. However the foregoing approach is disadvantageous in terms of time, and in order to improve a time performance, it is necessary to reference the TLB and BAA in parallel for high-speed processing. In that case, the BAA is referred to with the virtual address. More exactly, the BAA is referred to with a real address portion (in-page address) in the virtual address, which is a lower part of the virtual address which is unchanged even after the virtual-to-real address translation. In general, since data of the main storage is associated with data of the buffer storage by 32 bytes or 64 bytes (called a block), the number of bits usable when accessing the BAA is 6 or 7 at most.

FIG. 4 of the accompanying drawings is a block diagram showing one example of a buffer storage system in which the TLB and BAA are accessed in parallel. A memory access request created in the central processing unit stores a virtual address in a register 1. An entry of a TLB 2 is accessed by the lower bits of a page address of the virtual address. In this example, the TLB 2 is composed of k columns×2 rows, wherein 2-1 and 2-2 designate first and second rows, respectively. Namely, there are k entries in each of the first and second rows. Each entry of each of the first and second rows 2-1, 2-2 of the TLB 2 is composed of a virtual address (L) portion, a valid flag bit (V) portion, and a real address (R) portion. The contents of the L and V portions read from each row of the TLB 2 are compared with upper bits of a page address in the register 1 using corresponding virtual address comparator circuits 4-1, 4-2.

On the other hand, a BAA 3 is accessed by the upper bits of the page address. In this example, the BAA 3 is composed of l columns×2 rows, wherein 3-1 and 3-2 designate the first and second rows, respectively. Namely, each of the first and second rows has l entries. In the described system which references TLB 2 and BAA 3 in parallel, the number of columns l of the BAA 3 is determined according to a block size is 4 KB (kilo bytes) and block size is 64 B (bytes), l=64 columns. The number of rows is determined according to the buffer memory capacity. Each entry of the BAA 3 is composed of a real address (R) portion and a valid flag bit (V) portion. Real address comparator circuits 6-1, 6-2 compare A.) a real address (page address) read from the R portion of the second row 2-1 of the TLB, or, B.) the real address (page address) stored in a register 1 by the central processing unit (both A. and B. being inputted via a selecting circuit), with the contents read from the corresponding R portions of the BAA rows 3-1, 3-2. The selecting circuit 5 selects the content of the register 1 if a real address is stored in the register 1 directly by the central processing unit, and selects the content of the first row 2-1 of the TLB if a virtual address is stored in the register 1. Other real address comparator circuits 7-1, 7-2 compare the real address read from the R portion of the second row 2-2 of the TLB with the corresponding real addresses read from the R portions of the first and second rows 3-1, 3-2 of the BAA. When the two inputs of each real address comparator circuit 6-1, 6-2, 7-1, 7-2 coincide with each other, its output will be "1".

The results of comparison by the real address comparator circuits 6-1, 6-2, 7-1, 7-2 are inputted to an encoder 8 and are selected according to the results of the virtual address comparator circuits 4-1, 4-2, and, thereafter, the encoded output (one bit in this example) is stored in an upper bit of a register 9. In the lower order bit positions of the register 9, an in-page address of the register 1 is stored. Thus a buffer storage address corresponding to a virtual address (or real address) stored in the register 1 is obtained in the register 9. The buffer storage is indexed by the address in the register 9, and the read data is transferred to the central processing unit.

As ultra LSIs (Large Scale Integrated Circuits) have recently been developed and improved, the realization of large-scale and high-speed computers are on the rise. Presumably this tendency will continue into the future. As a result of this increased integration, many logical units such as operational units are formed on a large scale integrated circuit for high-speed processing. Gates for distribution of address to memories and for collection of data read from memories occupy a majority of logical portions associated with the memories, and such components make the formation of an LSI difficult and are highly likely to become a critical constraint on minimization of a machine cycle of a computer. Further, the capacity of main storage also tends to be increased, and, as a result thereof, the capacity of the buffer storage is also required to be increased, namely, the capacity of the BAA is required to be increased. Large scale integration of memories has advanced a sufficient degree so that high-speed memories can be realized. Regarding the BAA, only 6 or 7 bits at most can be permitted for the number of columns in the system in which the TLB and BAA are accessed in parallel, while the large scale integration of memories results in an increase in the number of bits of a word. Consequently, a large-capacity BAA using conventional memories such as that of FIG. 6 is difficult to achieve due to a sharp increase in the number of package pins of the memories.

Assuming that a memory of 4K bits is composed of 64 words, such a memory can contain 64 bits per word and a resulting requirement for both address and data lines would reach 140 pins. In implementation of memory LSI components, a package size of the memory is limited by the number of input and output pins.

Japanese Patent Publication No. 57-57784 (Japanese Patent Laid-Open Publication No. 54-102930) discloses an apparatus in which TLB and BAA are composed of memories each having comparator circuits built therein. For example, the portions surrounded by dashed lines in FIG. 4 are built in a memory chip.

However, in this prior art, the real address translation read from the TLB is required to be outputted from the memory chip constituting the TLB, is then inputted to a memory chip constituting the BAA and is compared with real addresses within the BAA. Therefore, two disadvantages are encountered in that there is a propagation delay and the number of pins needed for input and output of the TLB and BAA is increased.

A solution has been proposed by Japanese Patent Laid-Open Publication No. 62-101944. This storage control apparatus comprises a first portion of a TLB, a second memory for holding a real address portion of a BAA, comparator circuits for comparing the output of the first memory with the output of the second memory, with all such arrangements being built in a memory device. The first and second memories are connected to different address signal inputs, and connected to a common dam-in signal input. This storage control apparatus is shown in FIG. 5. Like reference numerals designate similar parts or elements throughout FIGS. 4 and 5. A portion surrounded by a dashed line in FIG. 5 is a memory device chip disclosed in the Japanese Publication No.62-101944. This memory chip includes parts corresponding to the rows 3-1, 3-2 of BAA 3 and the comparator circuits 6-1, 6-2, 7-1, 7-2, which constitute the BAA 3 the R portions 2-13, 2-23 of each row which constitute the TLB 2, and the selecting circuit 5, all parts being built in the memory chip. Each row 3-1, 3-2 of the BAA is connected to a common input to be a column address, i.e., namely, to the upper bits of a page address of the address register 1. Each R portion 2-13, 2-23 of the TLB is connected to a common input to be a column address different from that of the BAA, i.e., namely, to the lower bits of a page address of the address register 1. Each row 3-1, 3-2 of the BAA and each R portion 2-13, 2-23 of the TLB are connected to a common dam-in signal input, namely, to a page address of the address register 1. With this arrangement, the real address read from the TLB can be compared with the real address read from the BAA, without any outputting/inputting of such read addresses with respect to external pins of the memory chip. The V portion of the BAA, like the R portion, may be inputted to the comparator circuits. Also the L portion, the V portion and the comparator circuits 4-1, 4-2 of the TLB may be formed as a memory chip with built-in comparator circuits.

FIG. 6 is a block diagram showing another storage control apparatus which is disclosed in Japanese Patent Laid-Open Publication No. 62-101944. In this apparatus, unlike the apparatus of FIG. 5, two memory devices are used. In FIG. 5, the number of rows of the BAA is 2. If the number of rows is more t n 2, it is often difficult to contain the elements in a single memory device. The example of FIG. 6 is particularly useful in such case. Either the memory device 100 or the memory device 101 has a construction identical with that of the memory device of FIG. 5. The R portions of 2-13, 2-13' of the memory devices 100, 101 are the R portion of the first row of the TLB, in which identical real addresses are stored. Further, the R portions 2-23, 2-23' of the memory devices 100, 101 are the R portion of the second row of the TLB, in which identical real addresses are stored. Further, 3-1 and 3-2 of the memory device 100 are the first and second rows, respectively, of the BAA. Finally, 3-3 and 3-4 of the memory device 101 are the third and fourth rows, respectively, of the BAA.

Thus, by increasing the number of memory devices with respect to an increase of the number of rows of the BAA and by forming such in the respective memory devices the R portions constituting the same row of the TLB (similar to the example of FIG. 5), the real address read from the TLB can be compared with the R portion of the BAA, without requiring outputting/inputting of read real addresses from one chip to another.

In Japanese Patent Publication No. 57-57784 and Japanese Patent Laid-Open Publication No. 62-101944, assuming that the TLB includes m rows, the BAA includes n rows (practically, the TLB has two rows, while the BAA has two rows in FIGS. 4 and 5 and four rows in FIG. 6), m comparator circuits for real addresses of the TLB and BAA are needed per row of the BAA (m$\times$n in total), and n RAMs are needed for the BAA.

Therefore, if the TLB has two rows and the BAA has four rows, two comparator circuits per row of the BAA, namely, eight comparator circuits in total are needed. FIG. 2 is a layout diagram showing the case in which these elements are realized using a single memory device (LSI).

In FIG. 2, a data line 2-1 of the real address portion RO (2-13) of the row 0, which is the first row of the TLB, is connected to comparator circuits CO0 to C03 (6-1 to 6-4) and is thereby compared with each read data of the four rows B0 to B3 (3-1 to 3-4) of the BAA.

Likewise, a data line 20-2 of the real address portion R1 (2-23) of the row 1, which is the second row of the TLB, is connected to comparator circuits C10 to C13 (7-1 to 7-4) and is thereby compared with each read data of the four rows BO to B3 of the BAA. 300 and 301 in FIG. 2 designate repeat units (hereinafter called "macro cells") constituting a memory device with comparator circuits, the layouts of the macro cells 300, 301 being identical with each other. Even if the macro cells 300, 301 are located on a common chip, it is preferable that such macro cells be designed in a compact form and repeated across the common chip to reduce the number of layout designing steps of an LSI. In the prior art of FIG. 2, the real address portion of the TLB has a number of columns two times larger than the number of columns of the BAA by using RAMs equivalent to two RAMs of the BAA. Since the macro cells 300, 301 are the same units, the macro cell 300 including the real address portion of the TLB also includes comparators 10, 11, although they are not used.

In the prior art of FIG. 2, since one set of comparator circuits (COO to C03 or C 10 to C13) corresponding to each row of the TLB is extended in one direction (horizontally in the drawing), the data lines 20-1, 20-2 leading from the real address portions of the TLB to the comparator circuits of the BAA are required to be long, and also, intersection of the lines is caused.

To shorten the data lines 20-1, 20-2 leading from the TLB to the comparators, the comparator circuits COO to C03 associated with the row 0 of the TLB may be located on the left side, and the comparator circuits C10 to C13 associated with the row 1 of the TLB may be located on the right side, as shown in FIG. 3.

In the case of FIG. 3, instead of reducing the length of the data lines 20-1, 20-2, the data lines 30-1 to 30-4 leading from the BAA to the comparator circuits are elongated as compared to the case of FIG. 2, and still cause an intersection of the data lines. This intersection and elongation of the data lines chiefly increases sparasitic capacitances associated therewith and hence causes an increase in signal delay due to the non-ideal layout of the data lines. The signal delay due to the data lines has increased in ratio to the total delay time as a working speed of modem gate devices or other elements has increased. As a further disadvantage of the non-ideal layout, the area required for wiring the datelines is increased so that the required size of the resultant chip is enlarged.

SUMMARY OF THE INVENTION

It is therefore an object of this invention to provide a buffer storage control apparatus and a related address comparing apparatus, which are capable of easing wiring restrictions that otherwise would require an increase in the length of wiring lines.

Another object of the invention is to provide a buffer storage control apparatus and an address comparing apparatus, in which an intersection of wiring lines is minimized.

Still another object of the invention is to provide a buffer storage control apparatus and an address comparing apparatus, which enables an arrangement of component elements in such a manner which reduces the length of wiring lines and minimizes intersections of wiring lines.

According to a first aspect of the invention, there is provided a buffer storage control apparatus for a computer employing a virtual storage system and a buffer storage system, comprising: a translation lookaside buffer including m (where $m \geq 2$) rows; a buffer address array including n (where $n \geq 1$) rows; and $m \times n$ comparator circuits for comparing an output of each of the n rows of the buffer address army with an output of each of the n rows of the translation lookaside buffer; wherein the buffer storage control apparatus has m sets of n rows of the buffer address array, the $m \times n$ comparator circuits being allocated one to each of said $m \times n$ buffer address array in total.

According to a second aspect of the invention, them is provided a buffer storage control apparatus comprising m (where $m \geq 2$) rows of a translation lookaside buffer and n (where $n \geq 1$) rows of a buffer address array, both for being referred to in parallel in accessing a storage, wherein m sets of the n rows of buffer address array are provided, each set being allocated to each row of said m rows of the translation lookaside buffer, each of the m sets of the buffer address arrays storing the same content.

According to a third aspect of the invention, there is provided an address comparing apparatus comprising m (where $m \geq 2$) first RAMs for storing addresses, $m \times n$ (where $n \geq 1$) second RAMs each for storing addresses to be compared with the respective outputs of the m first RAMs, and $m \times n$ comparator circuits for comparing each of the outputs of the $m \times n$ second RAMs with the respective output of the m first RAMs, wherein the $m \times n$ second RAMs are divided into m sets each including n RAMs, each of said m sets storing the same content, the output of one of the $m \times n$ second RAMs being inputted to only one of the $m \times n$ comparator circuits.

According to a fourth aspect of the invention, there is provided an integrated circuit for an address comparing apparatus, comprising: m (where $m \geq 2$) first RAMs for storing addresses; m sets of n (where $n \geq 1$) second RAMs each for storing addresses to be compared with the respective outputs of the m first RAMs; and $m \times n$ comparator circuits for comparing each of the outputs of the $m \times n$ second RAMs with the respective output of the m first RAMs; there being a plurality of groups each composed of one of the m first RAMs, n of the $m \times n$ second RAMs, and n of the $m \times n$ comparator circuits, the groups being arranged independently of one another to avoid any crossing of connecting lines leading from the first and second RAMs to the comparator circuits.

According to a fifth aspect of the invention, there is provided an integrated circuit for an address comparing apparatus, comprising: m (where $m \geq 2$) first RAMs for storing addresses; m sets of n (where $n \geq 1$) second RAMs each for storing addresses to be compared with the respective outputs of the m first RAMs; and $m \times n$ comparator circuits for comparing each of the outputs of the $m \times n$ second RAMs with the respective output of the m first RAMs; there being m cells each including at least n of the $m \times n$ second RAMs and n of the $m \times n$ comparator circuits, the m cells being repeatedly arranged.

In the prior art buffer control apparatus, the cause for the elongation and intersection of wiring lines is that identical outputs of the individual rows of the BAA are supplied to a plurality of comparator circuits corresponding to rows of the TLB. As a consequence, the wiring lines leading from the TLB to the comparator circuits are elongated as shown in FIG. 2, and the wiring lines leading from the BAA to the comparator circuits are elongated as shown in FIG. 3. In either case, an intersection of wiring lines cannot be avoided.

To the contrary, in this invention, each row of the TLB is provided with a separate set of all rows of the BAA. Namely, one set of n rows of the BAA is provided for each of m rows of the TLB. Therefore the BAA has m×n rows in total. The contents of every i-th rows of the individual sets of n rows of the BAA are identical with one another.

With this arrangement, each row of RAMs of the BAA can be allocated to each of the comparator circuits on a one to one basis. Therefore, a plurality of groups are arranged independently of one another, each group including each row of the TLB, a comparator circuit associated therewith, and one row of RAMs of the BAA. As a result, the distance between LSI components to be interconnected is shortened so that the length of wiring lines can be reduced and any intersection of wiring lines can be avoided. Thus it is possible to reduce signal delay due to the wiring lines and to minimize the area occupied by the wiring lines.

In this invention, the memory (RAM) of the buffer storage control apparatus contains redundant circuit components in order to reduce the length of wiring lines. For minimizing the increase of the area of the RAM resultant from making the RAM redundant, CMOS (complementary metal oxide semiconductor) or BiCMOS (bipolar-CMOS), which can be integrated on large scale, can be used as RAM. Additionally, if RAM in the form of CMOS, which is relatively low in speed but integrateable on large scale, is used, it is possible to compensate for its low speed characteristic by using the RAM redundantly.

The above and other advantages, features and additional objects of this invention will be manifest to those versed in the art upon making reference to the following detailed description and the accompanying drawings, in which several preferred structural embodiments incorporating the principles of this invention are shown by the way of illustrative example.

DETAILED DESCRIPTION

Embodiments of this invention will now be described in greater detail.

Figure 1:
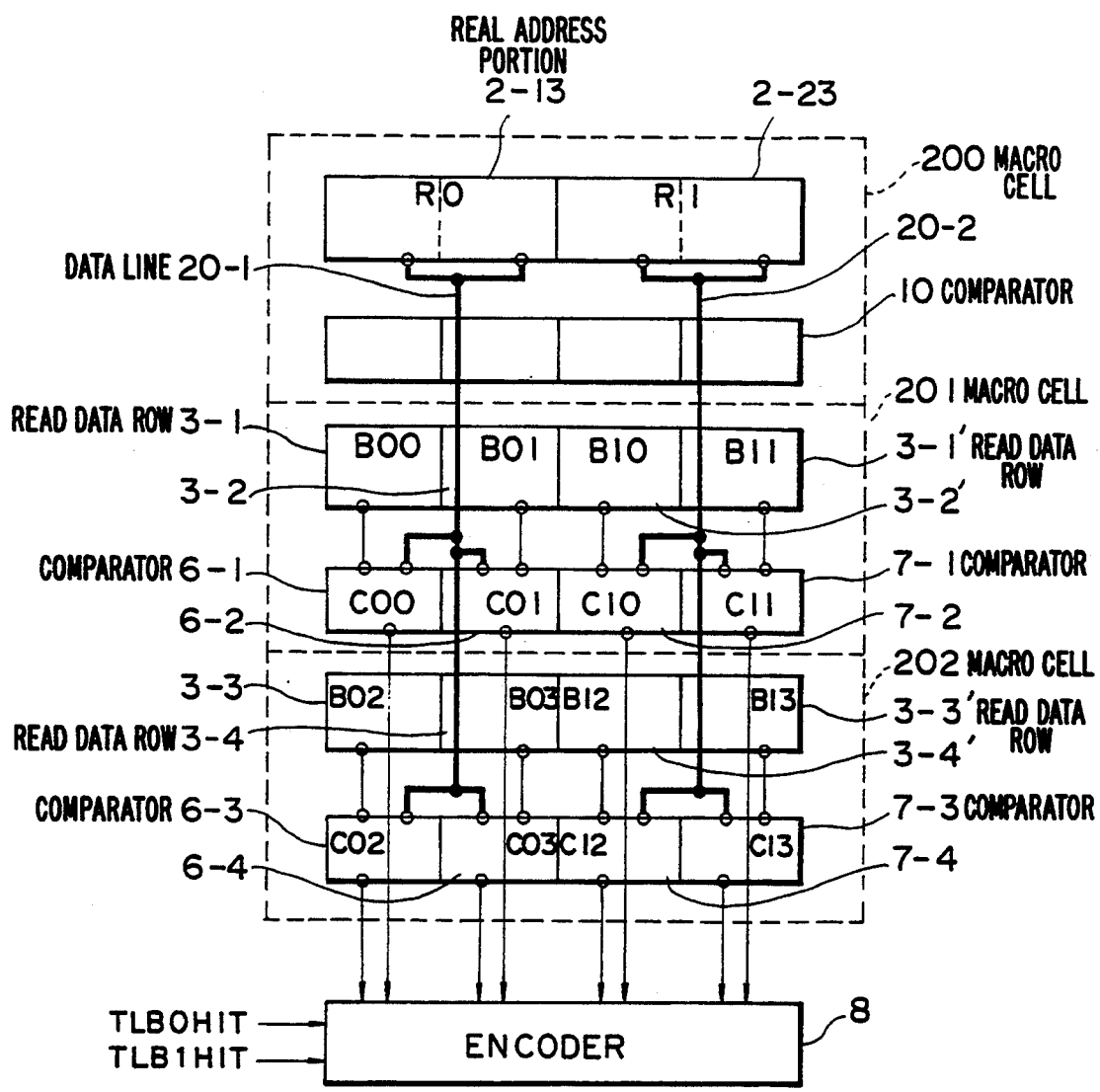
FIG. 1 is in LSI layout image diagram showing one embodiment of a buffer storage control apparatus of this invention.

FIG. 1 is a layout diagram of a memory with logical circuits according to one embodiment of this invention. Similar to FIG. 2, TLB has two rows, and BAA has four rows. The BAA, unlike that of FIG. 2, has one set of rows B00 to B03 (3-1 to 3-4) corresponding to a row R1 (a TLB real address portion of a row 0) of the TLB, and also has one set of rows B10 to B13 (3-1' to 3-4') corresponding to a row R1 (a TLB real address portion of a row 1 ) of the TLB. The data in one set of rows B00 to B03 of the BAA are exactly identical with the data in the other set of rows B10 to B13. Loading data in the BAA, or deleting (invalidating) data requires writing to both sets of rows in the BAA (B00 to B03 and B10 to B13) in order to guarantee coincidence of both data.

Figure 2:
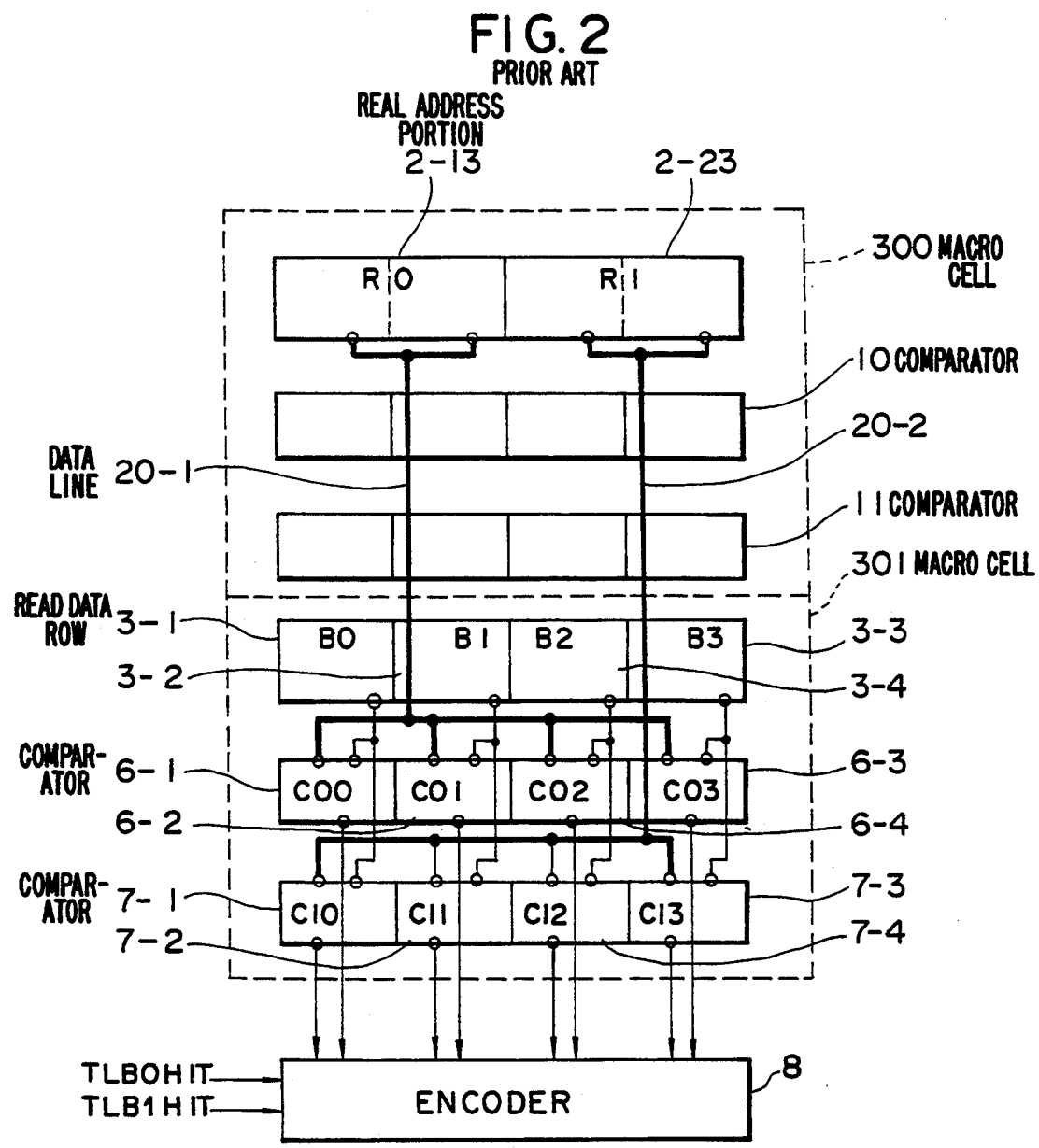
FIG. 2 is an LSI layout image diagram similar to FIG. 1, showing a prior art apparatus.

The number of comparator circuits 6-1 to 6-4 (for the row 0 of the TLB) and 7-1 to 7-4 (for the row 1 of the TLB) of the BAA is identical with that of FIG. 2.

Figure 4:
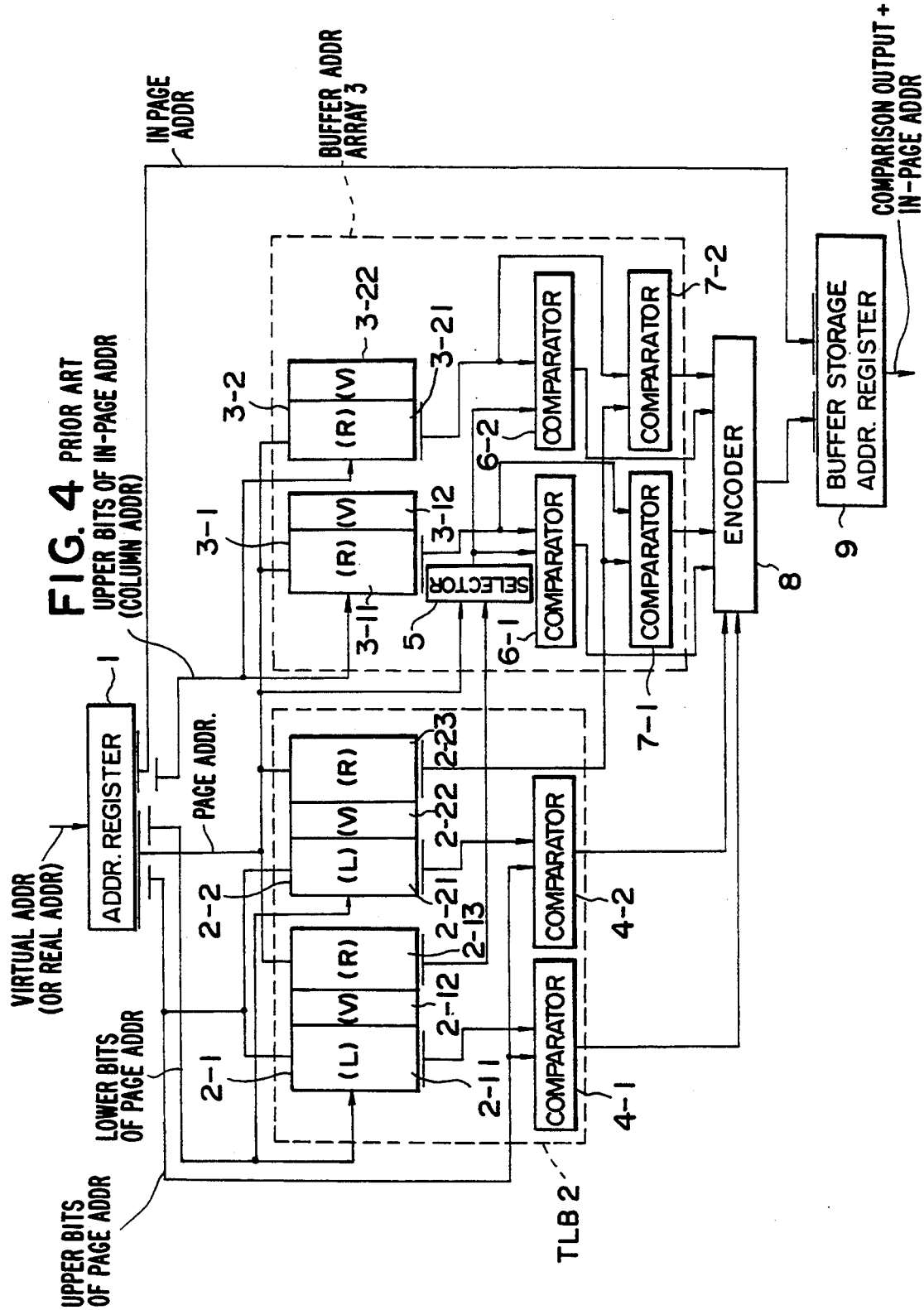

Therefore, compared with the prior art of FIG. 2, the embodiment of FIG. 1 is logically identical therewith (identical in number of rows and columns of TLB and BAA) and has the following differences therefrom:

(1) The number of RAMs within the BAA is 8 (i.e., 4×2) in FIG. 1 and 4 (i.e., 4×1) in FIG. 2.

(2) The redundancy unit of the layout is composed of three macro cells 200 to 202 in FIG. 1 and two macro cells 300 to 301 in FIG. 2. Assuming that the BAA has l columns, the macro cell of FIG. 1 is composed of four RAMs of l columns and four comparator circuits, while the macro cell of FIG. 2 is composed of four RAMs of l columns and eight comparator circuits.

(3) Since four comparator circuits are arranged laterally for the same row of TLB in FIG. 2 while only two comparator circuits are arranged laterally for the same row in FIG. 1, the length of the wiring lines 20-1, 20-2 of the real address portions of the TLB can be shortened more in FIG. 1 than in FIG. 2. As a result, both signal delay and wiring area can be minimized more in FIG. 1 than in FIG. 2. This is because the macro cell is vertically divided into two independent portions of the row 0 side and row 1 side of the TLB as the BAA is provided corresponding to the rows of the TLB. Since the wiring lines between the rows of the TLB can be omitted with this layout, it is possible to reduce the length of wiring lines and to simplify the wiring layout. This difference (3) is the primary object of this invention.

TABLE 1

|  |  | FIG. 1 | FIG. 2 |
|---|---|---|---|
| The number of macro cells per chip |  | 3 | 2 |
| content of macro cell | RAMs | 4 | 4 |
|  | comparators | 4 | 8 |
| entire chip | RAMs | 12 | 8 |
|  | comparators | 12 | 16 |

As shown in Table 1, in the entire chip, the number of comparator circuits of FIG. 1 is smaller than that of FIG. 2, and the number of RAMs of FIG. 1 is larger than that of FIG. 2. Whether the occupied area of RAM and comparator circuits in FIG. 1 is larger or smaller than that in FIG. 2 depends on the areas of RAM and comparator circuits. However, the length and area of wiring lines of FIG. 1 may be smaller than that of FIG. 2.

Figure 3:
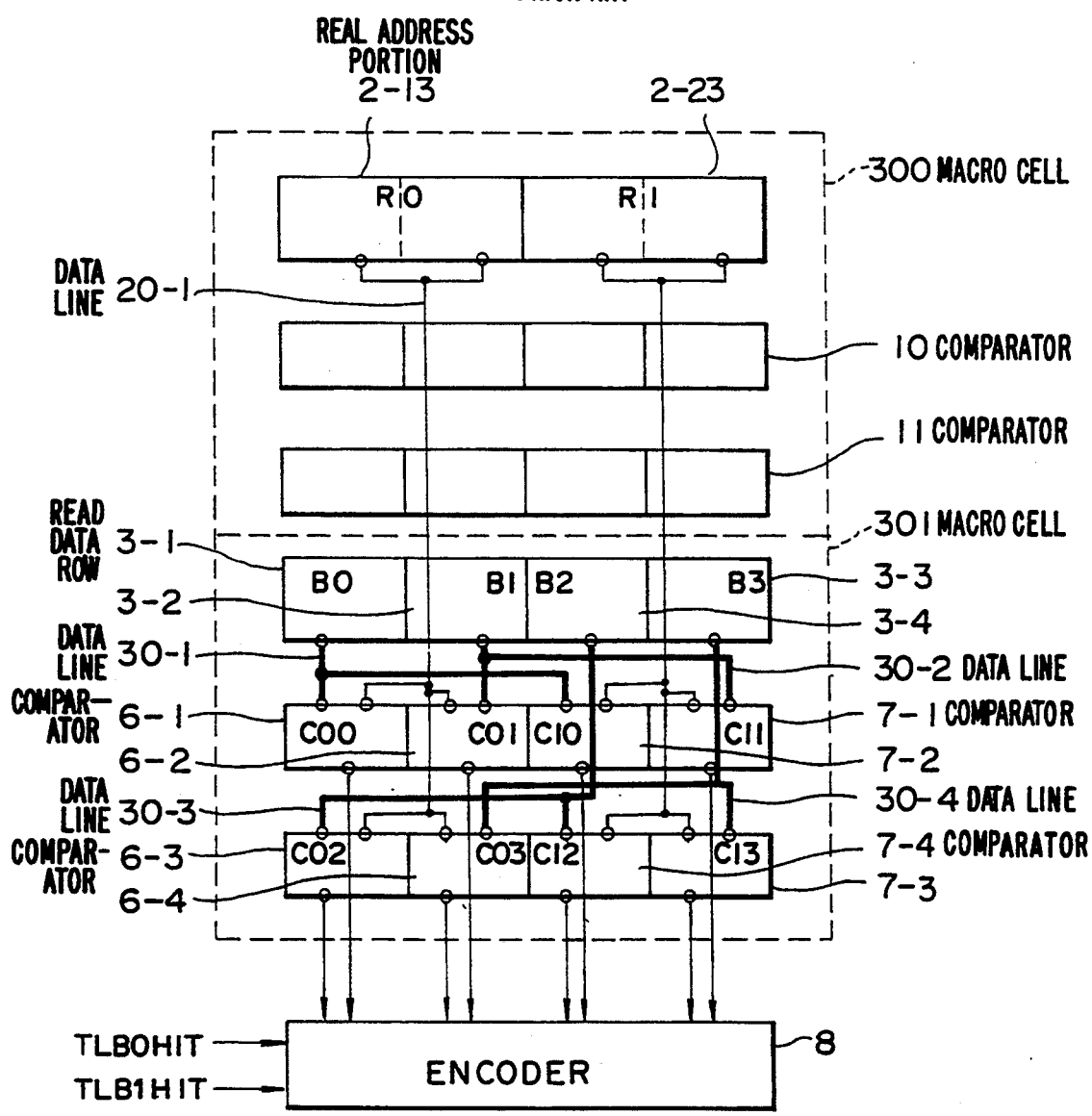
FIGS. 3 through 6 are block diagrams showing prior art buffer storage control apparatuses.

In the prior art arrangement, as shown in FIGS. 2 and 3, even though the layout of the component elements is changed, it is generally difficult to reduce the length of the wiring lines and to avoid intersection of the wiring lines. The length of the wiring lines cannot be shortened unless there are provided a plurality of sets of BAAs corresponding to the individual rows of TLB, as shown in FIG. 1 which illustrates one embodiment of this invention.

Figure 5:
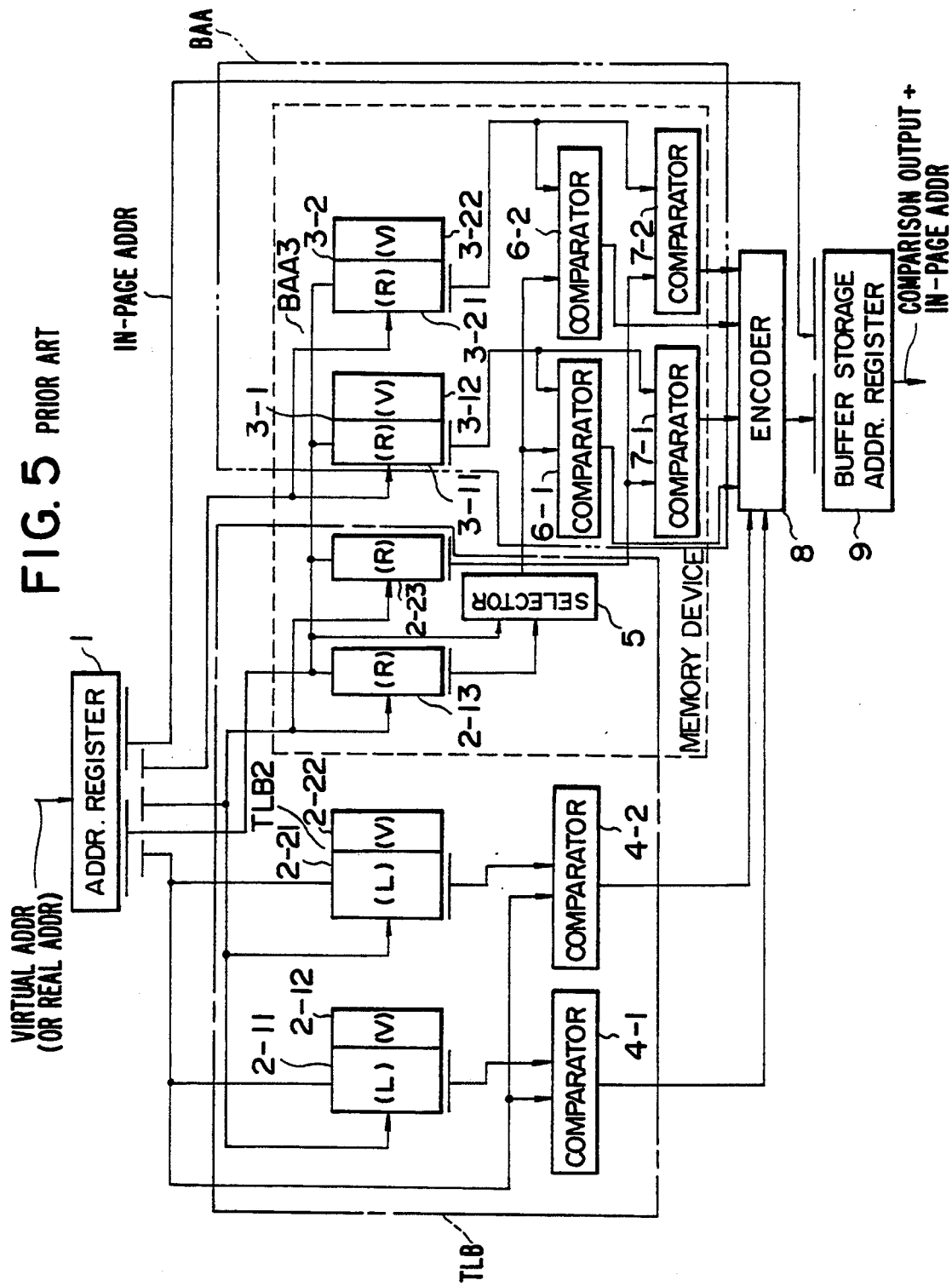
Figure 6:
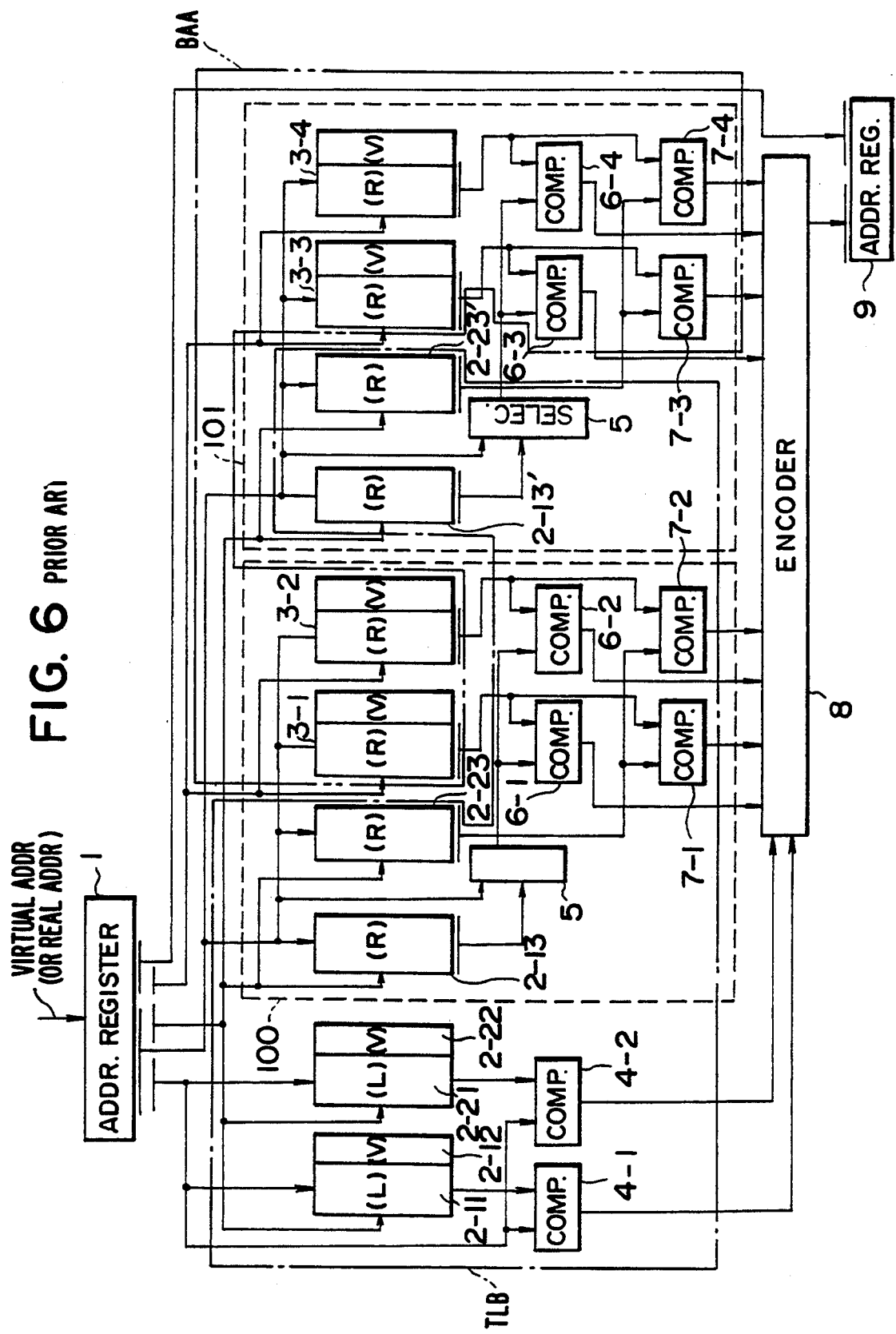
Figure 7:
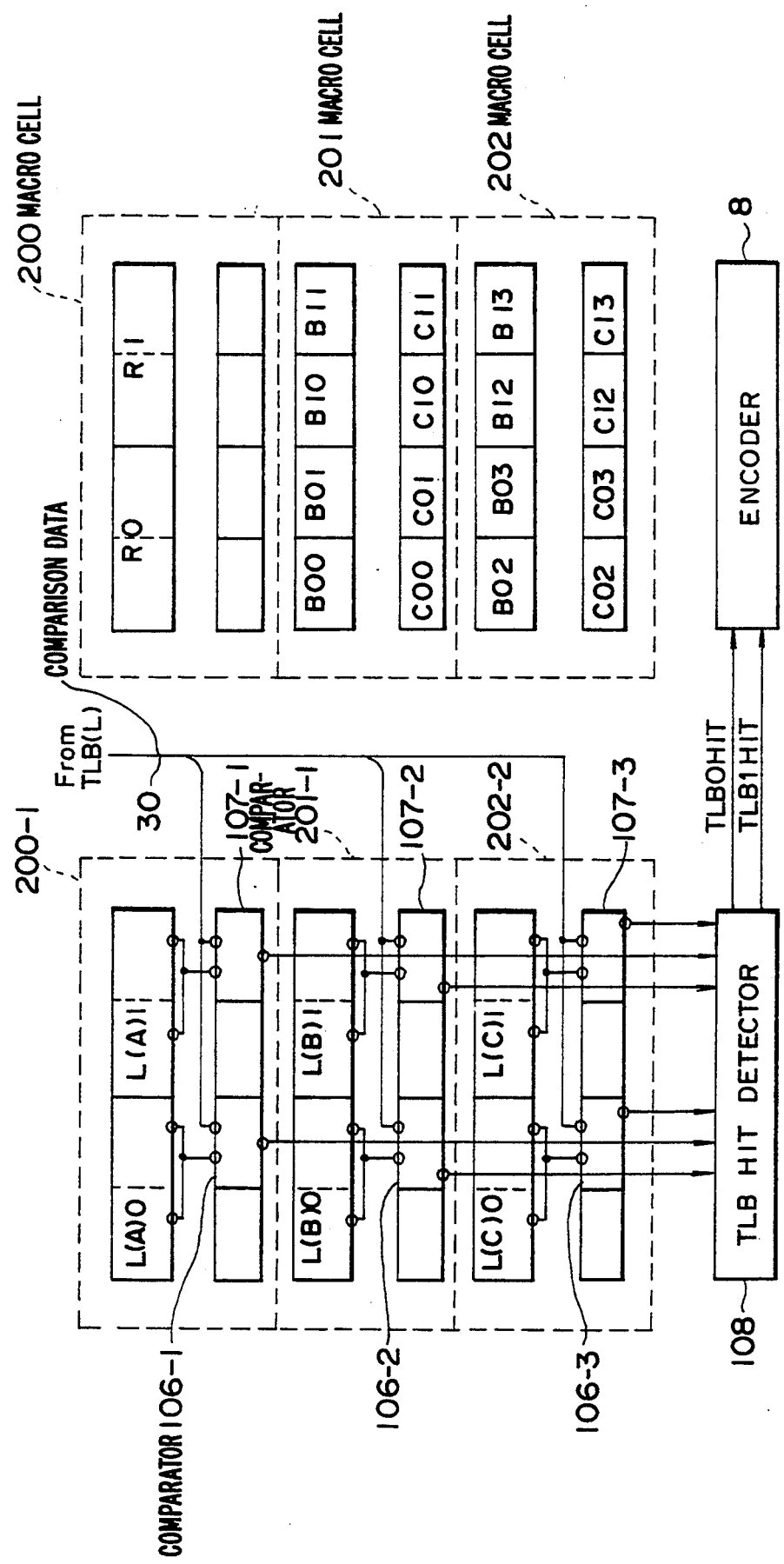
FIG. 7 is an LSI layout image diagram showing an example in which the same layout of FIG. 1 is applied also to a logical address portion of TLB.

As shown in FIG. 7, it is possible to construct L portions (occasionally including all or part of logical addresses, address space identifiers, etc., corresponding to the L portions 2-11, 2-21 of FIG. 5) of logical addresses of the TLB by changing the wiring with use of macro cells 200, 201,202 each of which includes the RAMs and comparator circuits of FIG. 1. In FIG. 7, the macro cells 200 to 202 are identical with those of FIG. 1, and the illustration of the wiring is omitted here for clarity.

In FIG. 7, the macro cells 200-1,201-1,202-1 correspond to the macro cells 200, 201,202 of FIG. 1 and are different therefrom only in wiring. Further, the L portion is composed of three portions, i.e. L(A), L(B) and L(C), each having row 0 and row 1. The L portion comparison data (logical addresses, space identifiers, etc.) 30 of the TLB are inputted from outside the macro cells to comparator circuits 106-1 to 106-3 and 107-1 to 107-3 and are compared with the output data of the RAMs. The results of this comparison are inputted to a TLB hit detector circuit 108 to generate a signal TLB0-HIT or TLB1HIT indicating whether or not a hit has occurred on either of rows 0 and 1 of the TLB. These signals are inputted to an encoder 8.

Thus, since the L and R portions of TLB and BAA are constructed using identical macro cells, the number of steps of designing and the number of steps of inspection can be reduced.

This invention should by no means be limited to this illustrated specific example, and various modifications may be suggested without departing from the scope of appended claims.

For example, in the illustrated embodiment, the TLB has two rows, and the BAA has four rows. Alternatively, if the number of rows of TLB is two or more, and the number of rows of BAA is one or more, this invention also may be adopted.

Further, in the illustrated embodiment, the macro cells 200 to 201 are formed within the same LSI circuit. Even if the macro cells are formed on separate LSI circuits, this invention has the result that the length and occupied area of wiring lines can be reduced as compared to the prior art in which there is provided only one set of BAA components within a redundancy portion.

According to this invention, since a restriction to wiring lines between the component elements of a buffer storage control apparatus is eased, the layout of the component elements which enables a designer to shorten the length of the wiring lines can be achieved. As a result, signal propagation delay is minimized so that buffer storage control can be performed at high speed, thus improving the performance of a computer.

What is claimed is:

1. A buffer storage control apparatus comprising:
   a translation lookaside buffer including m (where m≧2) rows forming a virtual storage system;
   a buffer address array including m sets of n (where n≧1) rows forming a buffer storage system, corresponding buffer locations in each set of said m sets of n rows of said buffer address array storing a same content; and
   m sets of n comparator circuits, each set of m sets of n comparator circuits being provided for a corresponding group of a respective set of said m sets of n rows of said buffer address array and a respective one row of said m rows of said translation lookaside buffer, for comparing n outputs of each set of said m sets of n rows of said buffer address array with corresponding m outputs of said respective one row of said m rows of the translation lookaside buffer.

2. A buffer storage control apparatus according to claim 1, wherein said translation lookaside buffer and said buffer address array are accessed in parallel.

3. A buffer storage control apparatus according to claim 1, wherein a same type of components of at least one of said translation lookaside buffer, said buffer address array and said comparator circuits are aligned along predetermined directions on an integrated circuit.

4. A buffer storage control apparatus according to claim 1, wherein said translation lookaside buffer, said buffer address array and said comparator circuits are divided into m corresponding groups, with each group of said m corresponding groups including one of the m rows of said translation lookaside buffer, n rows of said buffer address array and n comparator circuits, said m groups being disposed adjacent one another on an integrated circuit.

5. A buffer storage control apparatus according to claim 4, wherein: A.) in each group of said m corresponding groups, each row of said n rows of said buffer address array is paired with a corresponding one circuit of said n comparator circuits to represent a related pair; and B.) in each related pair, each row of Said buffer address array is disposed closer to a corresponding row of said m rows of said lookaside buffer than a corresponding circuit of said comparator circuits.

6. A buffer storage control apparatus according to claim 5 wherein a same type of components of at least one of said translation lookaside buffer, said buffer address array and said comparator circuits are aligned along predetermined directions on an integrated circuit.

7. An address comparing apparatus, comprising:
   m (where m≧2) translation lookaside RAM (random access memory) devices for storing m translation sets of first addresses;
   m sets of n (where n≧1) buffer address RAM devices, each buffer set of said m sets of n buffer address RAM devices corresponding to a respective translation set of said m translation sets of said m translation lookaside RAM devices and storing n sets of second addresses to be compared with said first addresses stored in a corresponding one of said m translation lookaside RAM devices, each buffer set of said m sets of n buffer address RAM devices having respective storage locations corresponding to respective storage locations of other buffer sets of said m sets of n buffer address RAM devices and storing a same content; and
   m sets of n comparator circuits, each set of said m sets of n comparator circuits corresponding to a corresponding group of a respective buffer set of said n buffer address RAM devices and a respective translation set of said m translation lookaside RAM devices and comparing n outputs of corresponding n buffer address RAM devices with an output of a corresponding translation set of said m translation lookaside RAM devices.

8. An address comparing apparatus according to claim 7, wherein said m translation lookaside RAM devices, said m sets of n buffer address RAM devices and said m sets of n comparator circuits are divided into m corresponding groups, each corresponding group including one of said m translation lookaside RAM devices, n buffer address RAM devices and n comparator circuits, said m corresponding groups being disposed adjacent one another on an integrated circuit.

9. An address comparing apparatus according to claim 8, wherein a same type of components of at least one of said translation lookaside RAM devices, said buffer address RAM devices and said comparator circuits are aligned along predetermined directions on an integrated circuit.

10. An address comparing apparatus according to claim 8, wherein in each of said m corresponding groups, each of said buffer address RAM devices is paired with a corresponding comparator circuit of said comparator circuits, with each buffer set of said n buffer address RAM devices being disposed adjacent to the corresponding translation set of the m sets of said translation lookaside RAM devices and a corresponding comparator set of said n comparator circuits.

11. An address comparing apparatus according to claim 10, wherein a same type of components of at least one of said translation lookaside RAM devices, said buffer address RAM devices and said comparator circuits are aligned along predetermined directions on an integrated circuit.

12. An integrated circuit including an address comparing apparatus, comprising:
m (where $m \geq 2$) translation lookaside RAM (random access memory) devices for storing m translation sets of first addresses;
m sets of n (where $n \geq 1$) buffer address RAM devices, each buffer set of said m sets of n buffer address RAM devices corresponding to a respective translation lookaside RAM of said m translation lookaside RAM devices, and storing n sets of second addresses to be compared with said first addresses stored in a corresponding translation lookaside RAM device of said m translation lookaside RAM devices; and
m sets of n comparator circuits, each set of said m sets of n comparator circuits corresponding to a corresponding group of a respective buffer set of said m sets of n buffer address RAM devices and a respective translation lookaside RAM device of said m translation lookaside RAM devices and comparing n outputs of corresponding n buffer address RAM devices with an output of a corresponding said translation lookaside RAM device of said m translation lookaside RAM devices;
wherein said integrated circuit has a plurality of corresponding groups, each comprised of one of said m translation lookaside RAM devices, n of said buffer address RAM devices, and n of said comparator circuits, said corresponding groups being arranged separately from one another on said integrated circuit to avoid any crossing of connecting lines leading from said translation lookaside RAM devices and said buffer address RAM devices to said comparator circuits.

13. An integrated circuit according to claim 12, wherein said integrated circuit is composed of juxtaposed macro cell regions in an integrated circuit layout, each of said macro cell regions including n of said comparator circuits and n RAMs used as one of said m translation lookaside RAM devices and n of said buffer address RAM devices.

14. An integrated circuit according to claim 13, wherein said macro cell regions are aligned in a first direction while in each of said macro cell regions, said n RAMs are aligned in a second direction perpendicular to said first direction with corresponding comparator circuits being disposed at locations parallel to said n RAMs.

15. An integrated circuit according to claim 12, wherein said m translation lookaside RAM devices, said m sets of n buffer address RAM devices and said m sets of n comparator circuits are divided into m corresponding groups each group including one of said m translation lookaside RAM devices, n buffer address RAM devices and n comparator circuits, said m corresponding groups being disposed adjacent one another on an integrated circuit.

16. An integrated circuit according to claim 15, wherein in each of said m groups, each of said buffer address RAM devices is paired with a corresponding one of said comparator circuits, each set of said sets of said buffer address RAM devices being disposed adjacent to the corresponding set of the m sets of said translation lookaside RAM devices and a corresponding set of said n comparator circuits.

17. An integrated circuit according to claim 15, wherein a same type of components of at least one of said translation lookaside RAM devices, said buffer address RAM devices and said comparator circuits are aligned along predetermined directions on an integrated circuit.

18. An integrated circuit according to claim 16, wherein a same type of components of at least one of said translation lookaside RAM devices, said buffer address RAM devices and said comparator circuits are aligned along predetermined directions on an integrated circuit.

* * * * *